US010044171B2

(12) United States Patent
Tayebati et al.

(10) Patent No.: US 10,044,171 B2
(45) Date of Patent: Aug. 7, 2018

(54) SOLDER-CREEP MANAGEMENT IN HIGH-POWER LASER DEVICES

(71) Applicants: Parviz Tayebati, Sherborn, MA (US); Bien Chann, Merrimack, NH (US); Robin Huang, North Billerica, MA (US); Michael Deutsch, Derry, NH (US)

(72) Inventors: Parviz Tayebati, Sherborn, MA (US); Bien Chann, Merrimack, NH (US); Robin Huang, North Billerica, MA (US); Michael Deutsch, Derry, NH (US)

(73) Assignee: TERADIODE, INC., Wilmington, MA (US)

( * ) Notice: Subject to any disclaimer, the term of this patent is extended or adjusted under 35 U.S.C. 154(b) by 0 days.

(21) Appl. No.: 15/006,693

(22) Filed: Jan. 26, 2016

(65) Prior Publication Data
US 2016/0218482 A1 Jul. 28, 2016

Related U.S. Application Data

(60) Provisional application No. 62/108,250, filed on Jan. 27, 2015.

(51) Int. Cl.
*H01S 5/40* (2006.01)
*H01S 5/022* (2006.01)
*H01S 5/14* (2006.01)
*H01S 5/024* (2006.01)

(52) U.S. Cl.
CPC ........ *H01S 5/4087* (2013.01); *H01S 5/02272* (2013.01); *H01S 5/142* (2013.01); *H01S 5/4062* (2013.01); *H01S 5/02423* (2013.01)

(58) Field of Classification Search
CPC .. H01S 5/02423; H01S 5/02272; H01S 5/142; H01S 5/4062; H01S 5/4087; H01S 5/0216; H01S 5/024–5/02492; H01L 2224/11013; H01L 2224/2612–2224/26152; H01L 2224/10145; H01L 2224/10175
See application file for complete search history.

(56) References Cited

U.S. PATENT DOCUMENTS

| 5,729,561 | A  | * | 3/1998  | Hironaka | H01S 5/0224 |
| | | | | | 372/36 |
| 6,184,560 | B1 | * | 2/2001  | Kawai | H01L 31/0203 |
| | | | | | 257/415 |
| 2001/0048698 | A1 | * | 12/2001 | Lorenzen | H01S 5/024 |
| | | | | | 372/36 |
| 2005/0069266 | A1 | * | 3/2005  | Kouta | H01S 5/02264 |
| | | | | | 385/92 |

(Continued)

FOREIGN PATENT DOCUMENTS

| DE | 102008041690 A1 * | 3/2010 | ......... H01L 23/3735 |
| DE | 102013223110 A1 * | 5/2015 | ......... H01S 5/02236 |

(Continued)

*Primary Examiner* — Joshua King
(74) *Attorney, Agent, or Firm* — Morgan, Lewis & Bockius LLP

(57) ABSTRACT

In various embodiments, laser apparatuses include thermal bonding layers between various components and creep-mitigation systems for preventing or retarding movement of thermal bonding material out of the thermal bonding layers.

26 Claims, 12 Drawing Sheets

(56) References Cited

U.S. PATENT DOCUMENTS

| | | | | |
|---|---|---|---|---|
| 2006/0100314 A1* | 5/2006 | Arifuku | ............... | C09J 9/02 523/210 |
| 2006/0220259 A1* | 10/2006 | Chen | ............... | H01L 21/563 257/778 |
| 2009/0296762 A1* | 12/2009 | Yamaguchi | ............... | H01S 5/02208 372/34 |
| 2011/0007762 A1* | 1/2011 | Fukuda | ............... | H01S 5/02236 372/36 |
| 2011/0249694 A1* | 10/2011 | Nishiguchi | ............... | H01S 5/0224 372/43.01 |
| 2011/0310921 A1* | 12/2011 | Chann | ............... | G02B 27/0905 372/70 |
| 2012/0080789 A1* | 4/2012 | Shiota | ............... | H01L 24/14 257/737 |
| 2014/0027920 A1* | 1/2014 | Kodama | ............... | H01L 24/81 257/773 |

FOREIGN PATENT DOCUMENTS

| | | | | |
|---|---|---|---|---|
| JP | 02069987 A | * | 3/1990 | ............ H01S 5/024 |
| JP | 03218031 A | * | 9/1991 | ............ H01L 24/32 |
| JP | 11346031 A | * | 12/1999 | ............ H01S 5/024 |
| JP | WO 2009116132 A1 | * | 9/2009 | ........ H01S 3/09415 |
| JP | 2013225654 A | * | 10/2013 | ........ H01S 5/02236 |
| JP | 2013225667 A | * | 10/2013 | ........... H01S 5/0425 |

* cited by examiner

SOLDER-CREEP MANAGEMENT IN HIGH-POWER LASER DEVICES

RELATED APPLICATION

This application claims the benefit of and priority to U.S. Provisional Patent Application No. 62/108,250, filed Jan. 27, 2015, the entire disclosure of which is hereby incorporated herein by reference.

TECHNICAL FIELD

In various embodiments, the present invention relates to laser devices such as laser diodes, specifically apparatus and methods for mitigating solder creep in laser devices.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. One such issue is solder creep. High-power lasers typically feature the use of a laser emitter with one or more heat sinks or other thermal-management structures for heat dissipation, and these structures are often coupled to the emitter via a solder or other soft, malleable compound that maintains thermal contact between the emitter and heat sink even in the event of relative movement between the components resulting from thermal cycling.

While such solder-based solutions mitigate some of the reliability issues resulting from thermal cycling during high-power laser operation, the use of solder may also introduce other reliability issues such as solder creep. During solder creep, the solder develops internal voids that can coalesce and lead to crack nucleation. In addition, the solder may slowly work its way out from between the two mating surfaces. This problem is exacerbated by the fact that the components between which the solder is placed are typically clamped or screwed together in order to squeeze the components together and minimize any thermal distortion. This clamping force may increase the solder-creep rate, particularly during high-temperature operation when the solder is typically softer and more flowable.

Thus, there is a need for improved thermal-management systems for high-power lasers (e.g., laser diodes), particularly such systems that also mitigate creep of solder or other flowable joining compounds.

SUMMARY

In accordance with embodiments of the present invention, laser devices incorporating beam emitters such as laser diodes (e.g., single laser diodes, laser diode bars, or arrays thereof) incorporate one or more structures or systems for reducing or substantially preventing creep of a thermal bonding material (e.g., a solder or similar material), thereby enhancing thermal conductivity within the laser device and the reliability of the laser device. Specifically, thermal bonding layers between various components of the laser device (e.g., the beam emitter itself and/or heat-sinking components such as electrode mounts and housings) may incorporate not only the thermal bonding material, but also one or more structures for containing the thermal bonding material within the layer and/or within specific "pockets" or areas of the layer. For example, the thermal bonding material may be contained within specific areas and/or movement (e.g., flow due to stress resulting from thermal and/or mechanical cycling) of the thermal bonding material may be retarded by a rigid mesh, thermally conductive particles, posts, stops, layers of an adhesive material, and/or channels defined by one or more of the components themselves. Such structures may also be thermally conductive, as a portion of the heat flowing within the laser device may propagate through the structures.

In accordance with embodiments of the present invention, laser devices may also be thermally managed via a package that incorporates highly thermally and electrically conductive electrodes for driving the beam emitter, as well as a thermally conductive mount (that may be liquid cooled) that is electrically isolated from the electrodes. Specifically, the electrodes may include, consist essentially of, or consist of copper and be electrically connected to the anode and cathode of the beam emitter. The mount may include, consist essentially of, or consist of, e.g., aluminum, and may incorporate an electrically insulating layer between the mount and the electrode facing the mount. For example, the electrically insulating layer may include, consist essentially of, or consist of aluminum oxide and/or aluminum nitride layers that provide thermal conductivity therethrough but retard or substantially prevent electrical conduction therethrough. Aluminum nitride advantageously has a high thermal conductivity but a low electrical conductivity. As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohm·meter ($\Omega \cdot m$), at least $1 \times 10^{10} \Omega \cdot m$, or even at least $1 \times 10^{12} \Omega \cdot m$.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As known to those of skill in the art, lasers are generally defined as devices that generate visible or invisible light through stimulated emission of light. Lasers generally have properties that make them useful in a variety of applications, as mentioned above. Common laser types include semiconductor lasers, solid-state lasers, fiber lasers, and gas lasers. Semiconductor lasers (mostly laser diodes) may be electrically or optically pumped and generally efficiently generate very high output powers often at the expense of poor beam quality. Semiconductor lasers may produce low power with good spatial properties for application in, e.g., optical disc players. Yet other semiconductor lasers may be suitable for producing high pulse rate, low power pulses (e.g., for telecommunications applications). Special types of semiconductor lasers include quantum cascade lasers (for mid-infrared light) and surface-emitting semiconductor lasers (VCSELs and VECSELs), the latter also being suitable for pulse generation with high powers.

Solid-state lasers may be based on ion-doped crystals or glasses (e.g., doped insulator lasers) and may pumped with discharge lamps or laser diodes for generating high output power. Alternatively solid-state lasers may produce low power output with very high beam quality, spectral purity and/or stability (e.g. for measurement purposes). Some solid-state lasers may produce ultra-short pulses with picosecond or femtosecond durations. Common gain media for use with solid state lasers include: Nd:YAG, Nd:YVO$_4$, Nd:YLF, Nd:glass, Yb:YAG, Yb:glass, Ti:sapphire, Cr:YAG, and Cr:LiSAF.

Fiber lasers may be based on optical glass fibers which are doped with some laser-active ions in the fiber core. Fiber lasers may achieve extremely high output powers (up to kilowatts) with high beam quality. Narrow line width operation and the like may also be supported by fiber lasers. Gas lasers, which include helium-neon lasers, $CO_2$ lasers, argon ion lasers, and the like, may be based on gases which are typically excited with electrical discharges. Frequently used gases include $CO_2$, argon, krypton, and gas mixtures such as helium-neon. In addition, excimer lasers may be based on any of ArF, KrF, XeF, and $F_2$. Other less common laser types include chemical and nuclear pumped lasers, free electron lasers, and X-ray lasers.

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double heterostructure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that is usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators may be used to collimate the output beam along the fast-axis. Arrays of aspherical cylindrical lenses are often used for collimation of each laser element along the array or slow-axis. To achieve beams with approximately circular beam waist, a special beam shaper for symmetrization of the beam quality of each diode bar or array can be applied. A degrading property of diode bars is the "smile"—a slight bend of the planar nature of the connected emitters. Smile errors may have detrimental effects on the ability to focus beams from diode bars. Another degrading property is collimation error of the slow- and fast-axis. For example, a twisting of the fast-axis collimation lens results in an effective smile. This has detrimental effects on the ability to focus. In stacks, "pointing" error of each bar is often the most dominant effect. Pointing error is a collimation error and is the result of the array or bar that is offset from the fast-axis lens. An offset of 1 μm is the same as the whole array having a smile of 1 μm.

Diode bars and diode arrays overcome limitations of very broad single emitters, such as amplified spontaneous emission or parasitic lasing in the transverse direction or filament formation. Diode arrays may also be operated with a more stable mode profile, because each emitter produces its own beam. Techniques which exploit some degree of coherent coupling of neighbored emitters may result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator without beam conditioning in the slow-axis direction, or a more complex beam shaper to better preserve the brightness. It is also possible to launch the beamlets from the emitters into a fiber bundle (with one fiber per emitter). Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength may also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser apparatus that includes or consists essentially of a beam emitter having first and second opposed surfaces, a first electrode mount disposed beneath and in thermal contact with the first surface of the beam emitter, a thermally conductive housing body (e.g., a heat sink) disposed beneath the first electrode mount, a thermal bonding layer, and a creep-mitigation system. The thermal bonding layer is disposed between the first electrode mount and the housing body. The thermal bonding layer improves thermal conduction between the first electrode mount and the housing body. The thermal bonding layer includes, consists essentially of, or consists of a thermal bonding material. The creep-mitigation system may prevent or retard movement of the thermal bonding material out of the thermal bonding layer (i.e., movement of the thermal bonding material from between the first electrode mount and the housing body). The creep-mitigation system may prevent or retard the formation of voids within the thermal bonding material and/or the thermal bonding layer.

Embodiments of the invention may include one or more of the following in any of a variety of combinations. The beam emitter may include or consist essentially of one or more diode bars each emitting a plurality of discrete beams (e.g., laser beams). The thermal bonding material may include, consist essentially of, or consist of indium or an alloy or mixture of indium with one or more metals. The creep-mitigation system may include, consist essentially of, or consist of a mesh support structure defining a plurality of openings therein. At least a portion of the thermal bonding material may be disposed in the openings. The creep-mitigation system may include, consist essentially of, or consist of a plurality of thermally conductive particles interspersed within the thermal bonding layer. The creep-mitigation system may include, consist essentially of, or consist of a plurality of recessed channels defined by the first electrode mount and/or the housing body. At least some of the thermal bonding material may be disposed within at least one of the channels. The creep-mitigation system may include, consist essentially of, or consist of a plurality of posts defined by the first electrode mount and/or the housing body and protruding therefrom. At least one of the posts may span at least a portion of a distance between the first electrode mount and the housing body. The creep-mitigation system may include, consist essentially of, or consist of one or more stops disposed around at least a portion of a perimeter of the thermal bonding layer. The stops may be defined by the first electrode mount and/or the housing body and protrude therefrom. The creep-mitigation system may include, consist essentially of, or consist of an adhesive layer disposed around at least a portion of a perimeter of the thermal bonding layer. The adhesive layer may include, consist essentially of, or consist of a thermally conductive adhesive. The creep-mitigation system may include a plurality of posts spanning at least a portion of a distance between the first electrode mount and the housing body. At least one of the posts may include, consist essentially of, or consist of the thermally conductive adhesive. A second electrode mount may be disposed over and in thermal contact with the second surface of the beam emitter. The second electrode mount may be electrically insulated from the first electrode mount. The second electrode mount may be in electrical contact with the second surface of the beam emitter. The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough.

In another aspect, embodiments of the invention feature a laser apparatus that includes or consists essentially of a beam emitter having first and second opposed surfaces, a first electrode mount (e.g., a heat sink) disposed beneath the first surface of the beam emitter, a thermal bonding layer disposed between the first electrode mount and the first surface of the beam emitter, and a creep-mitigation system. The thermal bonding layer improves thermal conduction between the first electrode mount and the beam emitter. The thermal bonding layer includes, consists essentially of, or consists of a thermal bonding material. The creep-mitigation system may prevent or retard movement of the thermal bonding material out of the thermal bonding layer (i.e., movement of the thermal bonding material from between the first electrode mount and the beam emitter). The creep-mitigation system may prevent or retard the formation of voids within the thermal bonding material and/or the thermal bonding layer.

Embodiments of the invention may include one or more of the following in any of a variety of combinations. The beam emitter may include or consist essentially of one or more diode bars each emitting a plurality of discrete beams (e.g., laser beams). The thermal bonding material may include, consist essentially of, or consist of indium or an alloy or mixture of indium with one or more metals. The creep-mitigation system may include, consist essentially of, or consist of a mesh support structure defining a plurality of openings therein. At least a portion of the thermal bonding material may be disposed in the openings. The creep-mitigation system may include, consist essentially of, or consist of a plurality of thermally conductive particles interspersed within the thermal bonding layer. The creep-mitigation system may include, consist essentially of, or consist of a plurality of recessed channels defined by the first electrode mount and/or the beam emitter. At least some of the thermal bonding material may be disposed within at least one of the channels. The creep-mitigation system may include, consist essentially of, or consist of a plurality of posts defined by the first electrode mount and/or the beam emitter and protruding therefrom. At least one of the posts may span at least a portion of a distance between the first electrode mount and the beam emitter. The creep-mitigation system may include, consist essentially of, or consist of one or more stops disposed around at least a portion of a perimeter of the thermal bonding layer. The stops may be defined by the first electrode mount and/or the beam emitter and protrude therefrom. The creep-mitigation system may include a plurality of posts spanning at least a portion of a distance between the first electrode mount and the beam emitter. At least one of the posts may include, consist essentially of, or consist of a thermally conductive adhesive.

A second electrode mount may be disposed over and in thermal contact with the second surface of the beam emitter. The second electrode mount may be electrically insulated from the first electrode mount. The second electrode mount may be in electrical contact with the second surface of the beam emitter. The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough. The creep-mitigation system may include, consist essentially of, or consist of an adhesive layer disposed around at least a portion of a perimeter of the thermal bonding layer. The adhesive layer may include, consist essentially of, or consist of an adhesive material. The adhesive layer may include, consist essentially of, or consist of a thermally conductive adhesive material. The creep-mitigation system may include a plurality of posts spanning at least a portion of a distance between the first electrode mount and the beam emitter. At least one of the posts may include, consist essentially of, or consist of the thermally conductive adhesive material. The beam emitter and/or the first electrode mount may define a plurality of recessed channels therein. At least one of the channels may contain the adhesive material therein. A second electrode mount may be disposed over and in thermal contact with the second surface of the beam emitter. The second electrode mount may be in electrical contact with the second surface of the beam emitter. The second electrode mount may be electrically insulated from the first electrode mount. A second thermal bonding layer may be disposed between the second electrode mount and the second surface of the beam emitter. The second thermal bonding layer may improve thermal conduction between the second electrode mount and the beam emitter. The second thermal bonding layer may include, consist essentially of, or consist of a second thermal bonding material. The second thermal bonding material may include, consist essentially of, or consist of the same material as the thermal bonding material. The second thermal bonding material and the thermal bonding material may include, consist essentially of, or consist of different materials.

In yet another aspect, embodiments of the invention feature a wavelength beam combining laser system that includes or consists essentially of a beam emitter, focusing optics, a dispersive element, a partially reflective output coupler, a first electrode mount disposed beneath and in thermal contact with the first surface of the beam emitter, a thermally conductive housing body disposed beneath the first electrode mount, a thermal bonding layer disposed between the first electrode mount and the housing body, and a creep-mitigation system. The beam emitter emits a plurality of discrete beams (e.g., laser beams) and has first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The thermal bonding layer improves thermal conduction between the first electrode mount and the housing body. The thermal bonding layer includes, consists essentially of, or consists of a thermal bonding material. The creep-mitigation system may prevent or retard movement of the thermal bonding material out of the thermal bonding layer (i.e., movement of the thermal bonding material from between the first electrode mount and the housing body). The creep-mitigation system may prevent or retard the formation of voids within the thermal bonding material and/or the thermal bonding layer.

Embodiments of the invention may include one or more of the following in any of a variety of combinations. The dispersive element may include or consist essentially of a diffraction grating (e.g., a reflective grating or a transmissive grating). The thermal bonding material may include, consist essentially of, or consist of indium or an alloy or mixture of indium with one or more metals. The creep-mitigation system may include, consist essentially of, or consist of a mesh support structure defining a plurality of openings therein. At least a portion of the thermal bonding material may be disposed in the openings. The creep-mitigation system may include, consist essentially of, or consist of a plurality of thermally conductive particles interspersed within the thermal bonding layer. The creep-mitigation system may include, consist essentially of, or consist of a plurality of recessed channels defined by the first electrode mount and/or the housing body. At least some of the thermal bonding material may be disposed within at least one of the channels. The creep-mitigation system may include, consist essentially of, or consist of a plurality of posts defined by the first electrode mount and/or the housing body and protruding therefrom. At least one of the posts may span at least a portion of a distance between the first electrode mount and the housing body. The creep-mitigation system may include, consist essentially of, or consist of one or more stops disposed around at least a portion of a perimeter of the thermal bonding layer. The stops may be defined by the first electrode mount and/or the housing body and protrude therefrom. The creep-mitigation system may include, consist essentially of, or consist of an adhesive layer disposed around at least a portion of a perimeter of the thermal bonding layer. The adhesive layer may include, consist essentially of, or consist of a thermally conductive adhesive. The creep-mitigation system may include a plurality of posts spanning at least a portion of a distance between the first electrode mount and the housing body. At least one of the posts may include, consist essentially of, or consist of the thermally conductive adhesive. A second electrode mount may be disposed over and in thermal contact with the second surface of the beam emitter. The second electrode mount may be electrically insulated from the first electrode mount. The second electrode mount may be in electrical contact with the second surface of the beam emitter. The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough.

In another aspect, embodiments of the invention feature a wavelength beam combining laser system that includes or consists essentially of a beam emitter, focusing optics, a dispersive element, a partially reflective output coupler, a first electrode mount disposed beneath the first surface of the beam emitter, a thermal bonding layer disposed between the first electrode mount and the first surface of the beam emitter, and a creep-mitigation system. The thermal bonding layer improves thermal conduction between the first electrode mount and the beam emitter. The thermal bonding layer includes, consists essentially of, or consists of a thermal bonding material. The creep-mitigation system may prevent or retard movement of the thermal bonding material out of the thermal bonding layer (i.e., movement of the thermal bonding material from between the first electrode mount and the beam emitter). The creep-mitigation system may prevent or retard the formation of voids within the thermal bonding material and/or the thermal bonding layer. The beam emitter emits a plurality of discrete beams (e.g., laser beams) and has first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element.

Embodiments of the invention may include one or more of the following in any of a variety of combinations. The dispersive element may include or consist essentially of a diffraction grating (e.g., a reflective grating or a transmissive grating). The thermal bonding material may include, consist essentially of, or consist of indium or an alloy or mixture of indium with one or more metals. The creep-mitigation system may include, consist essentially of, or consist of a mesh support structure defining a plurality of openings therein. At least a portion of the thermal bonding material may be disposed in the openings. The creep-mitigation system may include, consist essentially of, or consist of a plurality of thermally conductive particles interspersed within the thermal bonding layer. The creep-mitigation system may include, consist essentially of, or consist of a plurality of recessed channels defined by the first electrode mount and/or the beam emitter. At least some of the thermal bonding material may be disposed within at least one of the channels. The creep-mitigation system may include, consist essentially of, or consist of a plurality of posts defined by the first electrode mount and/or the beam emitter and protruding therefrom. At least one of the posts may span at least a portion of a distance between the first electrode mount and the beam emitter. The creep-mitigation system may include, consist essentially of, or consist of one or more stops disposed around at least a portion of a perimeter of the thermal bonding layer. The stops may be defined by the first electrode mount and/or the beam emitter and protrude therefrom. The creep-mitigation system may include a plurality of posts spanning at least a portion of a distance between the first electrode mount and the beam emitter. At least one of the posts may include, consist essentially of, or consist of a thermally conductive adhesive.

A second electrode mount may be disposed over and in thermal contact with the second surface of the beam emitter. The second electrode mount may be electrically insulated from the first electrode mount. The second electrode mount may be in electrical contact with the second surface of the beam emitter. The first electrode mount may be in electrical contact with the first surface of the beam emitter. The first and/or second electrode mount may include, consist essentially of, or consist of copper, silver, or gold. The housing body may include, consist essentially of, or consist of aluminum. The housing body may define therewithin one or more cooling channels for the flow of cooling fluid (e.g., water or another heat-transfer liquid) therethrough. The creep-mitigation system may include, consist essentially of, or consist of an adhesive layer disposed around at least a portion of a perimeter of the thermal bonding layer. The adhesive layer may include, consist essentially of, or consist of an adhesive material. The adhesive layer may include, consist essentially of, or consist of a thermally conductive adhesive material. The creep-mitigation system may include a plurality of posts spanning at least a portion of a distance between the first electrode mount and the beam emitter. At least one of the posts may include, consist essentially of, or consist of the thermally conductive adhesive material. The beam emitter and/or the first electrode mount may define a plurality of recessed channels therein. At least one of the channels may contain the adhesive material therein. A second electrode mount may be disposed over and in thermal contact with the second surface of the beam emitter. The second electrode mount may be in electrical contact with the second surface of the beam emitter. The second electrode mount may be electrically insulated from the first electrode mount. A second thermal bonding layer may be disposed between the second electrode mount and the second surface of the beam emitter. The second thermal bonding layer may improve thermal conduction between the second electrode mount and the beam emitter. The second thermal bonding layer may include, consist essentially of, or consist of a second thermal bonding material. The second thermal bonding material may include, consist essentially of, or consist of the same material as the thermal bonding material. The second thermal bonding material and the thermal bonding material may include, consist essentially of, or consist of different materials.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "substantially" and "approximately" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
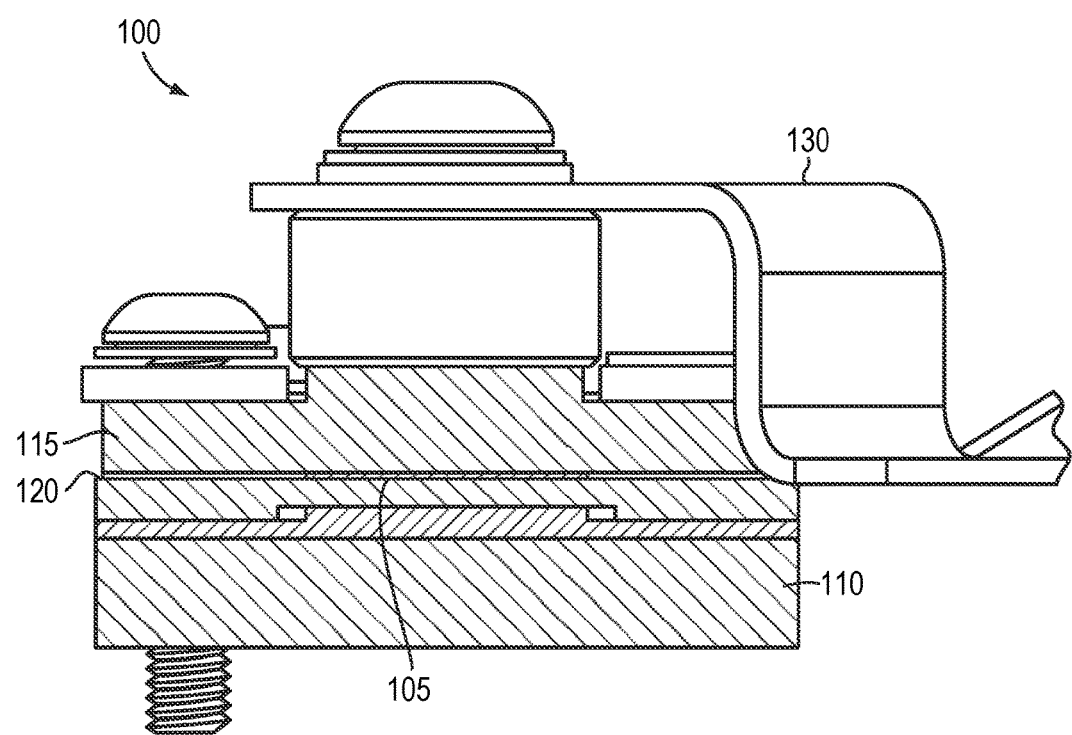
FIGS. 1 and 2 are, respectively, a side view and a perspective view of a packaged laser in accordance with embodiments of the invention.
Figure 2:
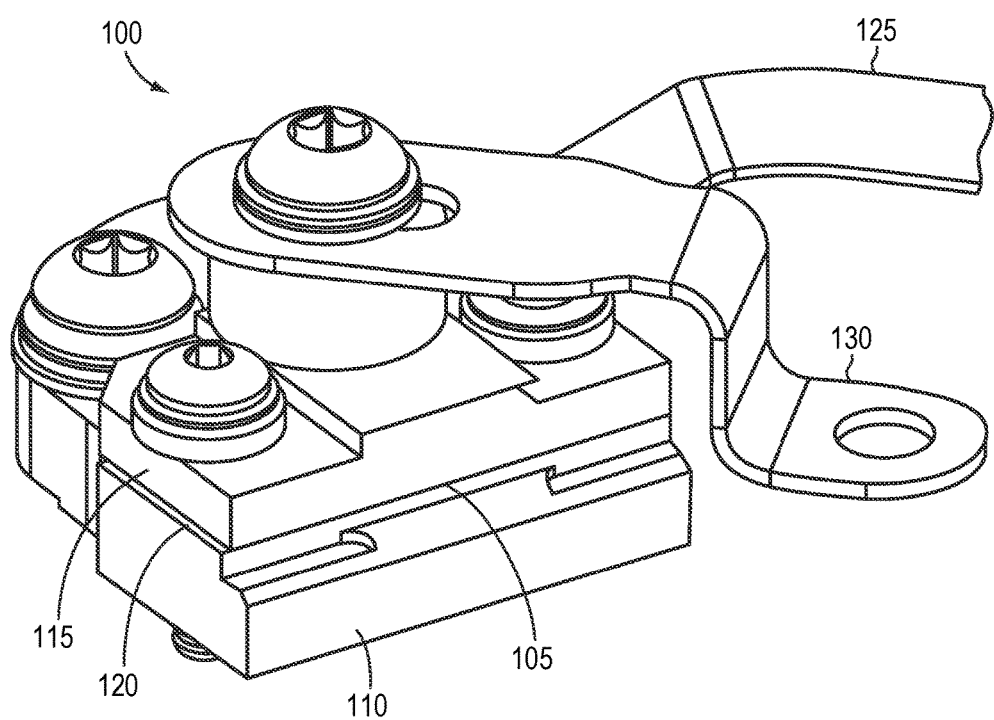

FIGS. 1 and 2 depict portions of an exemplary packaged laser 100 in accordance with embodiments of the present invention. As shown, the laser 100 includes a beam emitter 105 sandwiched between two electrode mounts 110, 115. The beam emitter 105 may include or consist essentially of, e.g., a laser diode, a diode bar, an array of laser diodes, an array of diode bars, or one or more vertical cavity surface-emitting lasers (VCSELs). The electrode mounts 110, 115 are thermally connected to the beam emitter 105 and each electrically connected to one of the electrodes (i.e., the anode and the cathode) of the beam emitter 105. For example, the electrode mount 110 may be electrically connected to the anode of beam emitter 105 and the electrode mount 115 may be electrically connected to the cathode of beam emitter 105, or vice versa. The electrode mounts 110, 115 are typically highly thermally and electrically conductive; thus, in various embodiments, the electrode mounts 110, 115 include, consist essentially of, or consist of one or more metals such as copper, silver, or gold. An insulating layer 120 is disposed around the beam emitter 105 and between the electrode mounts 110, 115, thereby electrically isolating the electrode mounts 110, 115 from each other. As shown, the electrode mounts 110, 115 may be fastened together and to the beam emitter 105 via, e.g., one or more fasteners such as screws, which may also attach the electrode mounts to a housing (as detailed below). Conductive contacts 125, 130 are connected to and extend from the electrode mounts 110, 115 in order to facilitate interconnection of the laser 100 to, for example, other laser devices (in series or in parallel) or to a source of electrical power (e.g., a current source). Laser 100 may also incorporate one or more features described in, and/or be fabricated in accordance with, U.S. Pat. No. 9,178,333, filed on Mar. 24, 2015, the entire disclosure of which is incorporated herein by reference.

Figure 3:
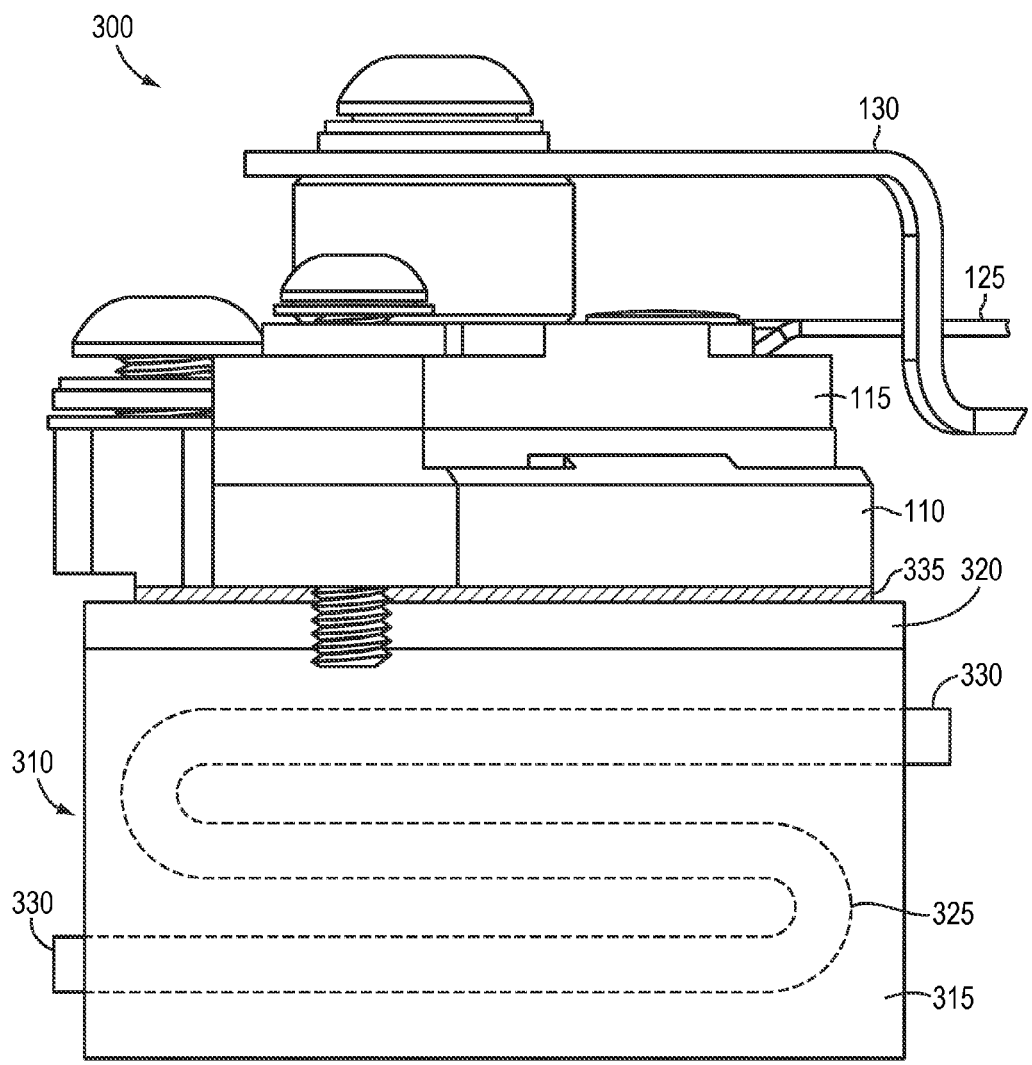
FIGS. 3 and 4 are side views of packaged lasers in accordance with embodiments of the invention.

FIG. 3 depicts a laser device 300 in which one or both electrode mounts 110, 115 are fastened or affixed to a thermally conductive housing 310. The housing 310 may include or consist essentially of a housing body 315 capped with an insulating layer 320 that retards or substantially prevents electrical conduction between the electrode mount 110 and the housing body 315 while maintaining thermal conductivity therebetween. For example, the insulating layer 320 may include, consist essentially of, or consist of aluminum nitride, boron arsenide, diamond, and/or beryllium oxide. In some embodiments, the insulating layer 320 may not be present. The housing body 315 may include, consist essentially of, or consist of one or more thermally conductive metals or ceramic materials. In an embodiment, the housing body 315 includes, consists essentially, or consists of a thermally conductive metal such as aluminum or copper. As shown in FIG. 3, the housing body 315 may also incorporate therewithin one or more cooling channels 325 through which a coolant (e.g., a liquid such as water) may flow to remove heat from the housing body. A coolant source and coolant sink may be connected to the cooling channel 325 via coolant interconnections 330. A coolant reservoir and, e.g., a heat exchanger, may be fluidly connected to the cooling channel 325 and provide coolant thereto. Such cooling systems are conventional and may be utilized with embodiments of the present invention without undue experimentation.

The insulating layer 320 may include, consist essentially of, or consist of, e.g., an oxide or a nitride of the metal of which the housing body 315 is composed. For example, for a housing body 315 that includes, consists essentially of, or consists of aluminum, the insulating layer 320 may include, consist essentially of, or consist of one or more layers of aluminum oxide and/or aluminum nitride. In some embodiments, a thermal bonding layer 335 is utilized to enhance contact (and thus thermal conduction) between the electrode mount 110 and the housing 310, even if the insulating layer 320 has a rough surface. The thermal bonding layer 335 may include, consist essentially of, or consist of, for example, a thermally conductive solder, foil, liquid, paste, or gel material such as indium (e.g., indium paste or solder) or silver paste. The thickness of the thermal bonding layer 335 may be, for example, between approximately 0.5 µm and approximately 150 µm. The thickness of the insulating layer 320 may be, for example, between approximately 5 µm and approximately 150 µm. In various embodiments, a thermal bonding layer 335 may also be present between the beam emitter 105 and one or both of the electrode mounts 110, 115. As described in more detail below, thermal bonding layers 335 and/or components in contact therewith in accordance with embodiments of the present invention may also incorporate one or more structures configured to minimize or prevent creep of the thermal bonding layer 335.

All or a portion of the insulating layer 320 may be a nitride layer formed via, e.g., direct nitridation of the housing body 315 and/or carbothermic reduction of an oxide layer on housing body 315. For example, an insulating layer 320 (or a topmost insulating layer 320) that includes, consists essentially of, or consists of aluminum nitride may be formed via exposure of an aluminum housing body 315 (or an aluminum oxide layer thereon) to a nitrogen ambient (i.e., a surrounding environment including nitrogen or a nitrogen-containing species) at elevated temperature (e.g., greater than 1200° C.). An aluminum oxide insulating layer 320 may be formed on an aluminum housing body 315 via, e.g., anodization. In an exemplary anodization process, the housing body 315 is first cleaned in either a hot soak cleaner or in a solvent bath and may be etched in sodium hydroxide (normally with added sodium gluconate), ammonium bifluoride, or brightened in a mix of acids. The anodized layer may be produced by passing a direct current through an electrolytic solution, with the housing body 315 serving as the anode (the positive electrode). The current releases hydrogen at the cathode (the negative electrode) and oxygen at the surface of the housing body 315 anode, creating a build-up of aluminum oxide. The voltage utilized for various solutions may range from 1 to 300 V DC, although most fall in the range of 15 to 21 V. Higher voltages are typically required for thicker coatings formed in sulfuric and organic acid. The anodizing current varies with the area of housing body 315 being anodized, and typically ranges from 30 to 300 amperes/meter$^2$ (2.8 to 28 ampere/ft$^2$).

In some embodiments, anodizing of aluminum housing bodies 315 is performed in an acid solution which slowly dissolves the aluminum oxide. The acid action is balanced with the oxidation rate to form a coating with nanopores 10-150 nm in diameter. These pores allow the electrolyte solution and current to reach the aluminum surface and continue producing the coating to greater thickness beyond what is produced by autopassivation. In some embodiments, these pores are sealed in order to prevent air or water from reaching the housing body 315 and initiating corrosion. In one implementation, a crystallized, partially crystallized, or micro-crystalline filler is placed into the pores, as disclosed in U.S. Pat. Nos. 8,512,872 and 8,609,254, the entire disclosure of each of which is incorporated by reference herein.

Pores in an insulating layer 320 may be at least partially impregnated or filled by introducing one or more compounds that are at least partially resistant to acidic attack or alkaline attack under various conditions. For example, the one or more compounds (e.g., metal cationic species) may be introduced into the pores by immersion of the housing body 315 in a bath containing one or more precursor compounds under conditions that are non-reactive to the housing body 315 or an oxide thereof. In accordance with various embodiments of the invention, the housing body 315, which may include, consist essentially of, or consist of anodized aluminum or an anodized aluminum alloy, is immersed in a first aqueous metal salt solution, preferably at ambient conditions. In addition or instead, one or more metal cationic species may be introduced into at least some of the pores by, for example, immersing the housing body 315 in an aqueous metal solution. The metal species or base metal salt in solution may at least partially impregnate at least a portion of the anodic oxide pores by diffusion phenomena. Non-limiting examples of the metal that may be utilized as a precursor compound include nickel, iron, zinc, copper, magnesium, titanium, zirconium, aluminum, and silver. The bath or aqueous metal solution may have a pH of less than about 7 and a temperature in a range of from about 15° C. to about 35° C.

Figure 4:
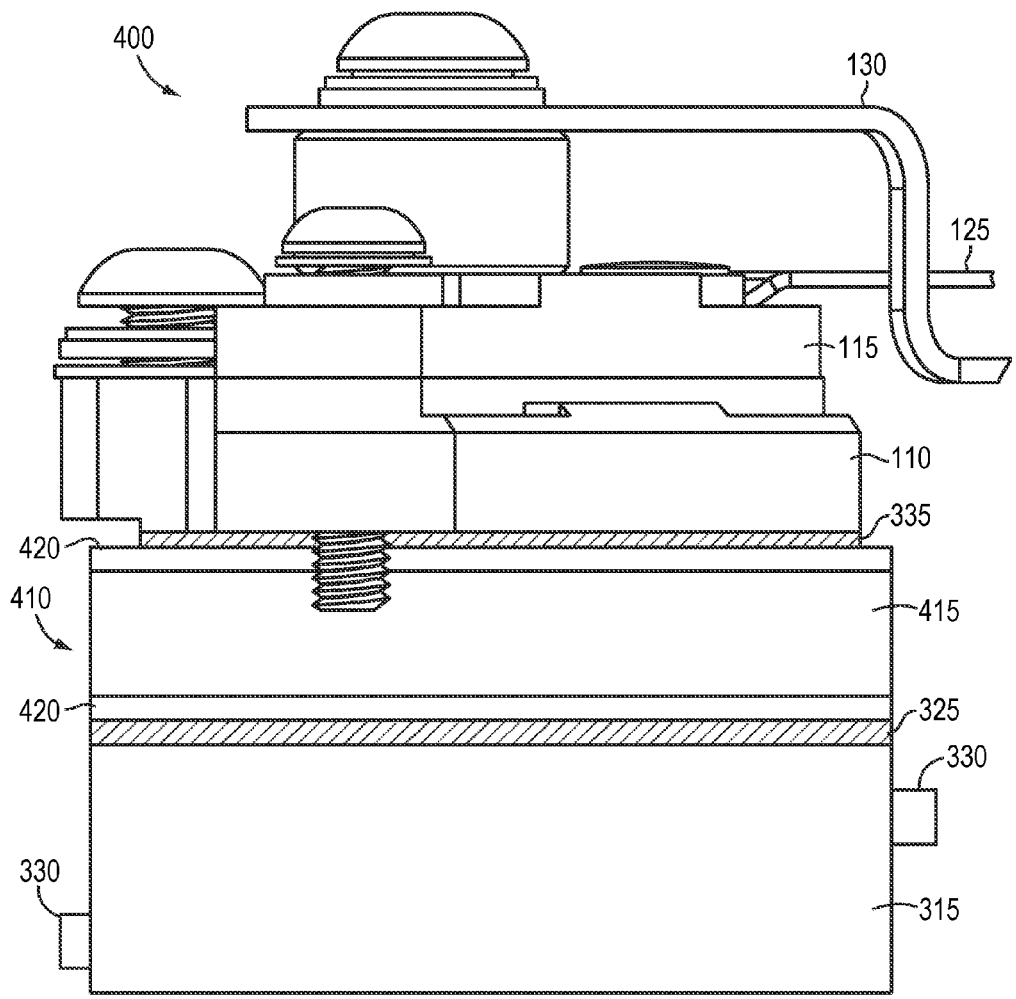

FIG. 4 depicts a packaged laser 400 featuring a composite housing 410 electrically insulated from but thermally connected to the electrode mount 110 of laser 100. As shown, the composite housing 410 may feature a ceramic body 415 mounted on and/or affixed to housing body 315. The ceramic body 415 may be thermally connected to electrode mount 110 and/or to housing body 315 via one or more thermal bonding layers 335 therebetween. The ceramic body 415 may include, consist essentially of, or consist of, for example, aluminum nitride. As shown in FIG. 4, the ceramic body 415 may also have interfacial layers 420 on one or more surfaces thereof. For example, the interfacial layers 420 may improve thermal conductivity to the bulk of the ceramic body 415 via increased interfacial contact (due to, e.g., reduced surface roughness) to the thermal bonding layers 335. The interfacial layers 420 may include, consist essentially of, or consist of one or more thermally conductive metals such as copper, silver, or gold. For example, the interfacial layers 420 may include, consist essentially of, or consist of direct-bond copper or copper flashing disposed on the ceramic body 415.

Figure 5A:
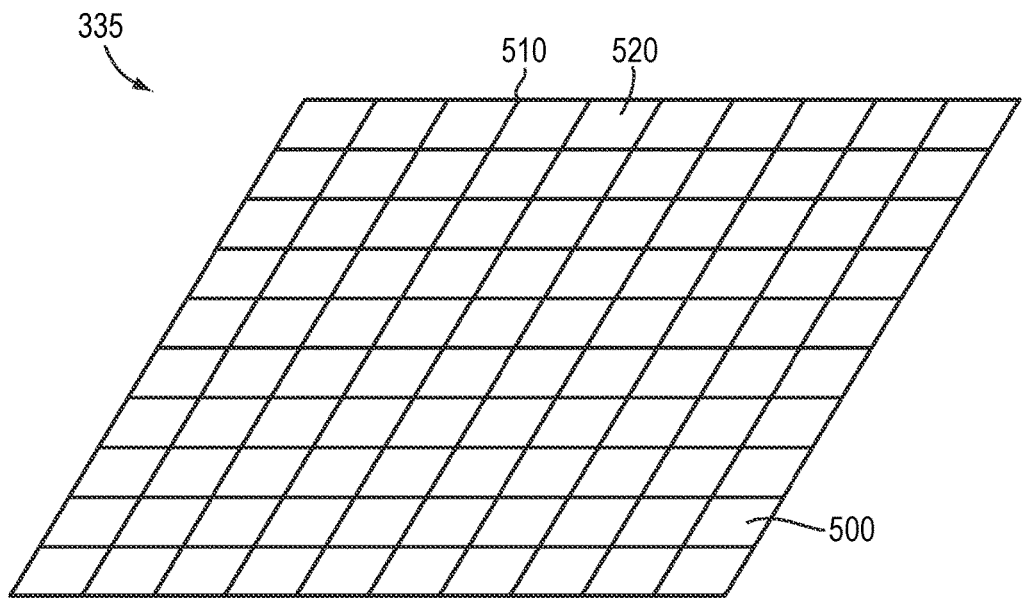
FIG. 5A is a perspective view of a thermal bonding layer incorporating a mesh support structure in accordance with embodiments of the invention.
Figure 5B:
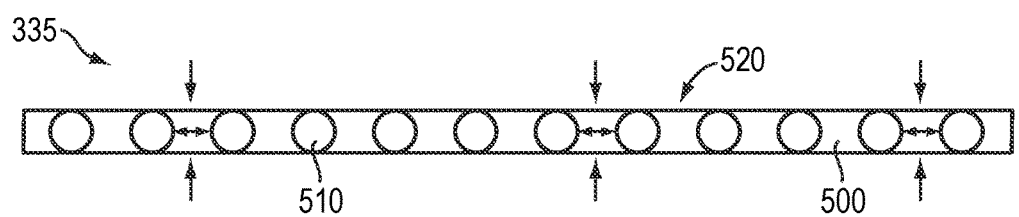
FIG. 5B is a cross-sectional view of the thermal bonding layer of FIG. 5A.

As mentioned above, various embodiments of the present invention feature structures and methods configured to minimize or reduce creep of one or more thermal bonding layers. FIGS. 5A and 5B depict a thermal bonding layer 335 that includes, consists essentially of, or consists of a thermal bonding material 500 and a mesh support structure 510. The thermal bonding material 500 may include, consist essentially of, or consist of, for example, a thermally conductive solder, foil, liquid, paste, or gel material that includes, consists essentially of, or consists of one or more materials such as indium, lead, tin, silver, and/or an alloy thereof. The thermal bonding material 500 may have a melting point between, e.g., approximately 90° C. and approximately 450° C., between approximately 100° C. and approximately 250° C., or between approximately 140° C. and approximately 200° C. The mesh support structure 510 may include or consist essentially of a network of wires or strands defining pockets 520 therebetween. The wires or strands of mesh support structure 510 include, consist essentially of, or consist of one or more materials that are thermally conductive (e.g., metals) and that have hardnesses higher than that of the thermal bonding material 500. For example, the wires or strands of mesh support structure 510 may include, consist essentially of, or consist of aluminum, copper, and/or stainless steel.

When utilized within a laser device in accordance with embodiments of the invention, most of the clamping force forcing various components together may be applied to the mesh support structure 510 of the thermal bonding layer 335, while the thermal bonding material 500 may be pressed into the pockets 520. In such a configuration, the thermal bonding material 500 may continue to provide thermal conductivity through the thermal bonding layer 335 while creep of the thermal bonding material 500 is minimized or substantially eliminated by the mesh of mesh support structure 510. That is, the thermal bonding material 500 tends to remain confined within at least some of the pockets 520 rather than undergoing creep and being lost from thermal bonding layer 335.

Figure 6A:
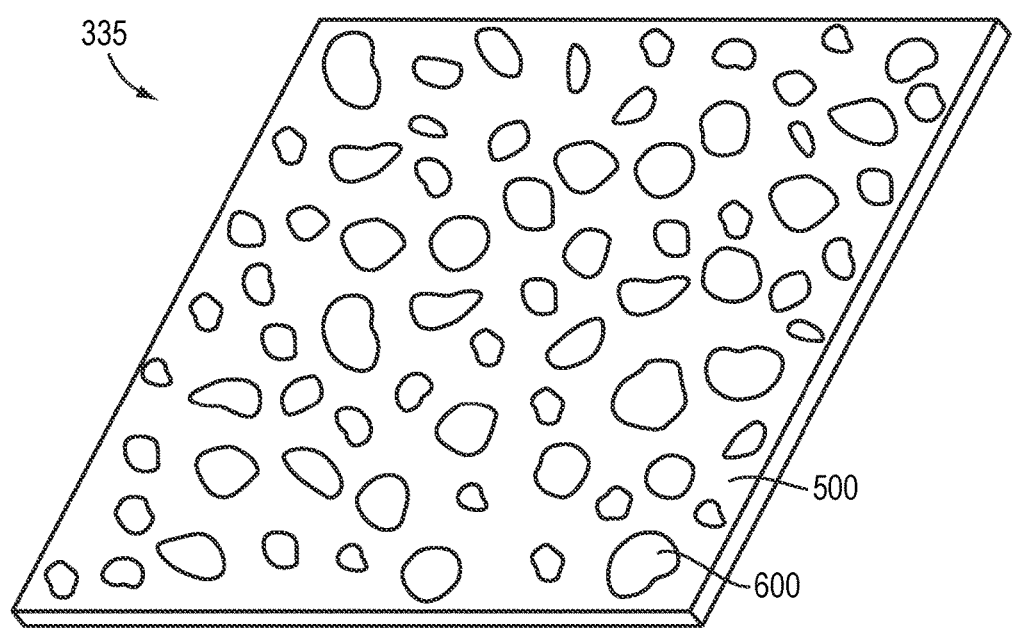
FIG. 6A is a perspective view of a thermal bonding layer incorporating particles in accordance with embodiments of the invention.
Figure 6B:
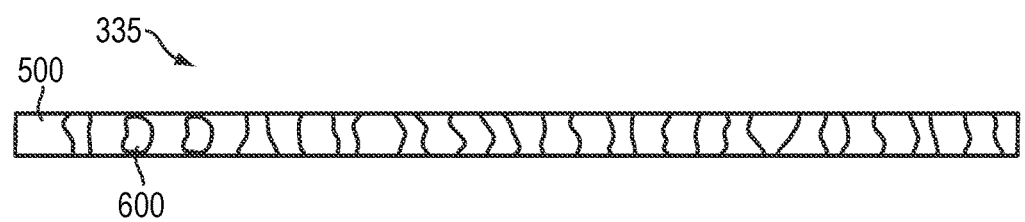
FIG. 6B is a cross-sectional view of the thermal bonding layer of FIG. 6A.

Similarly, FIGS. 6A and 6B depict a thermal bonding layer 335 in which the mesh support structure 510 is replaced by or supplemented with multiple support particles 600 interspersed within the thermal bonding material 500. The support particles 600 may all be composed of the same material, or different particles 600 may be composed of one or more different materials. The particles 600 include, consist essentially of, or consist of one or more materials that are thermally conductive (e.g., metals) and that have hardnesses higher than that of the thermal bonding material 500. For example, the particles 600 may include, consist essentially of, or consist of aluminum, copper, stainless steel, aluminum nitride, boron arsenide, diamond, and/or beryllium oxide. All or some of the particles 600 may be approximately spherical in shape, or they may have other shapes such as planar shavings, approximately cylindrical posts, etc. When utilized within a laser device in accordance with embodiments of the invention, most of the clamping force forcing various components together may be applied to the particles 600 of the thermal bonding layer 335, while the thermal bonding material 500 may be disposed therebetween. In such a configuration, the thermal bonding material 500 may continue to provide thermal conductivity through the thermal bonding layer 335 while creep of the thermal bonding material 500 is minimized or substantially eliminated by the particles 600. The particles 600 may both reduce the amount of clamping force applied to the thermal bonding material 500 and provide an impediment to free flow of the thermal bonding material 500 from between the components of the laser device. The particles 600 may have an average size (e.g., average diameter or other dimension such as height) less than or substantially equal to the thickness of the thermal bonding layer 335. The average size may be at least one-half of the thickness of the thermal bonding layer 335. For example, the particles 600 may span at least half of the distance, or even substantially the entire distance, between the components between which the thermal bonding layer 335 is disposed, and at least some of the particles 600 may even be in contact with both such components.

Figure 7:
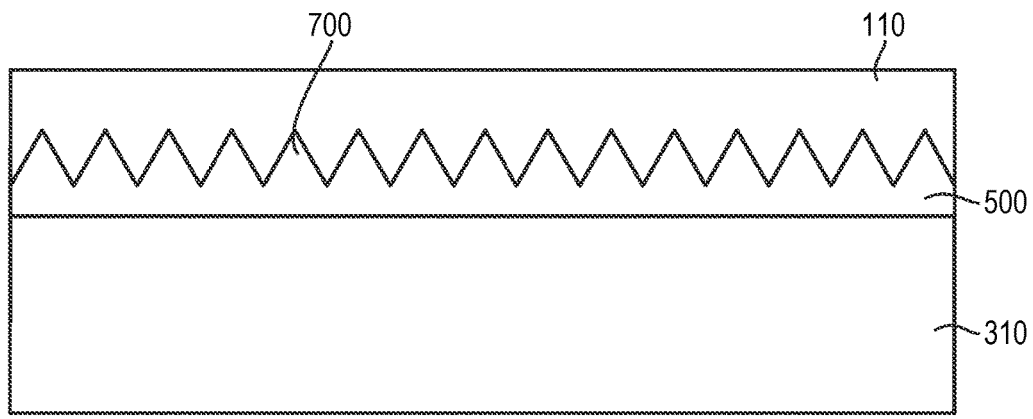
FIGS. 7 and 8 are cross-sectional views of portions of laser devices incorporating channels for containing thermal bonding material in accordance with embodiments of the invention.
Figure 8:
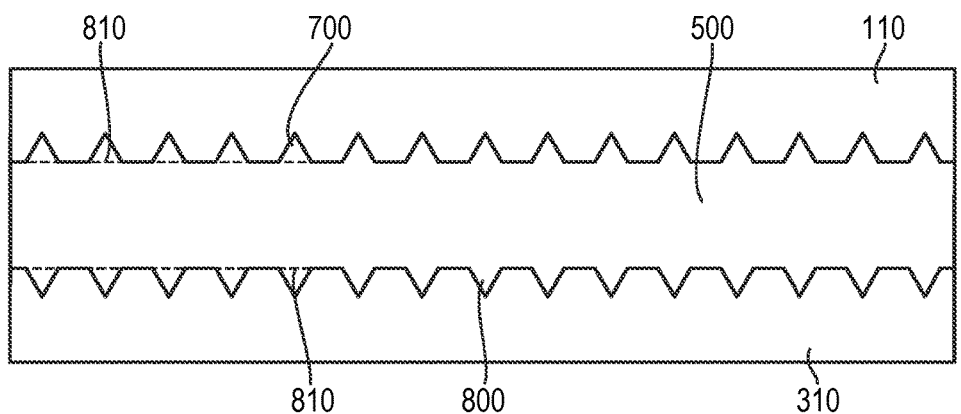

As shown in FIGS. 7 and 8, one or more structures for the mitigation of solder creep may be incorporated within the clamped components themselves, either in addition to or instead of a structure such as mesh 510 or particles 600 being incorporated into the thermal bonding layer 335 itself. As shown in FIG. 7, the electrode mount 110 (or other component of the laser device) may define one or more channels 700 that help to contain the thermal bonding material 500 at the interface between the electrode mount 110 and the thermally conductive housing 310. (FIGS. 7 and 8 depict as an example the interface between electrode mount 110 and thermally conductive housing 310, as shown in FIGS. 3 and 4; embodiments of the invention may incorporate channels or other structures for the mitigation of solder creep on one or more other structures with laser devices.) As shown in FIG. 8, the thermally conductive housing 310 may define one or more channels 800 implemented in addition to or instead of channels 700. As used herein, the term "channel" refers to a recessed region that does not necessarily extend from one end of a component to the opposite end thereof; rather, channels may be localized pockets. For example, as shown in FIG. 8, one or more channels 700, 800 may be at least partially defined by sidewalls or stops 810. When electrode mount 110 and thermally conductive housing 310 are clamped together, the thermal bonding material 500 tends to be confined within the channels; any creep of the thermal bonding material 500 tends to occur only within one or more channels, thereby preventing loss of the thermal bonding material 500 from the interface.

Figure 9:
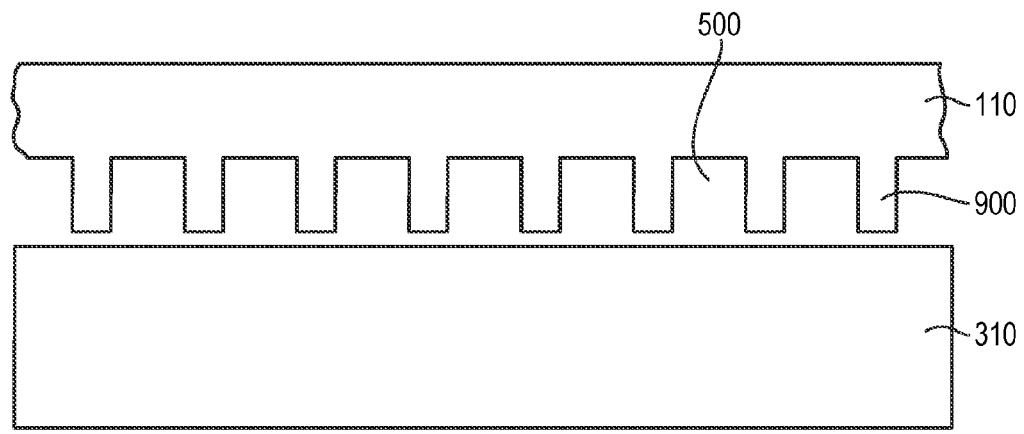
FIG. 9 is a cross-sectional view of portions of a laser device incorporating posts for containing thermal bonding material in accordance with embodiments of the invention.
Figure 10:
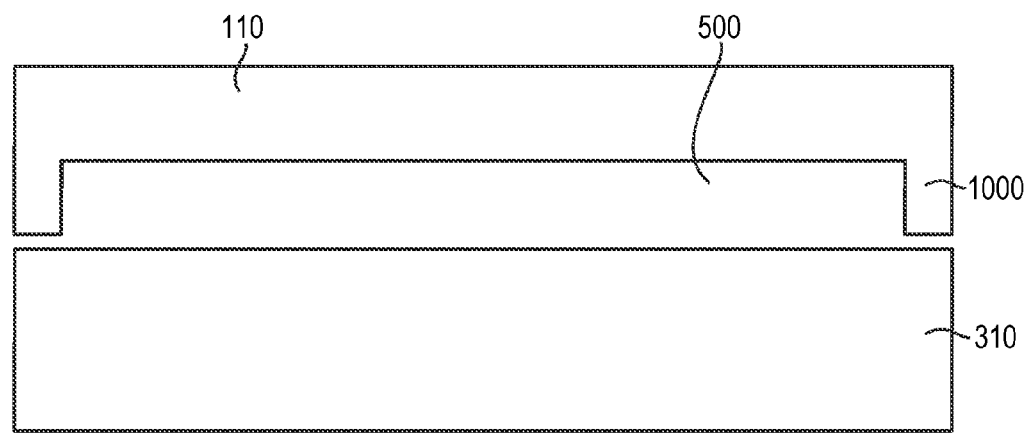
FIG. 10 is a cross-sectional view of portions of a laser device incorporating stops for containing thermal bonding material in accordance with embodiments of the invention.
Figure 11:
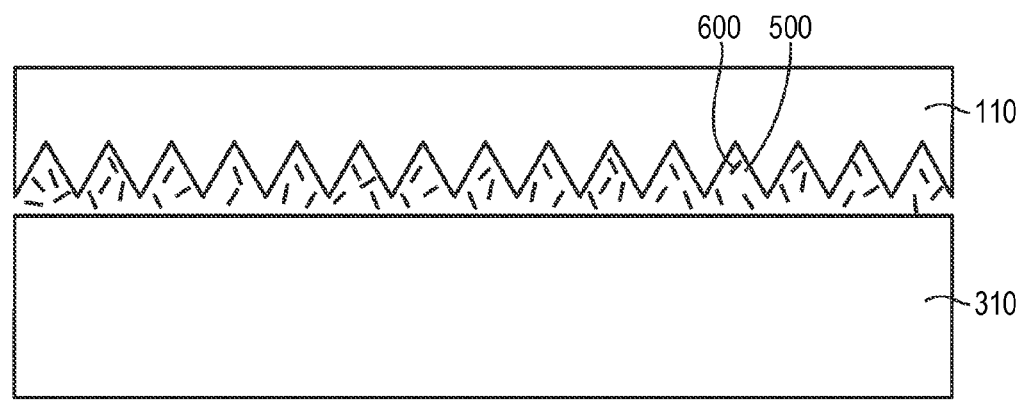
FIG. 11 is a cross-sectional view of portions of a laser device incorporating channels for containing thermal bonding material in accordance with embodiments of the invention.

As shown in FIG. 9, one or both of the components having thermal bonding material 500 at the interface therebetween may define multiple posts or rails 900 that in turn define a series of channels therebetween for containing the thermal bonding material 500. (As used therein, the term "post" includes not only post-like structures having one lateral (i.e., in the plane of the interface between clamped components) dimension approximately the same as another lateral dimension, but also rail-like structures in which one of the lateral dimensions is longer than the other.) In accordance with embodiments of the invention, the posts 900 take up at least most of the clamping force, contain the thermal bonding material 500 in limited areas, and/or impede the lateral movement of the thermal bonding material 500, thereby minimizing or substantially eliminating solder creep in the laser device. As shown in FIG. 10, the posts 900 may be supplemented or replaced by one or more stops 1000 disposed at the edge of the clamped components. In such embodiments, the thermal bonding material 500 may still receive most of the clamping force but be confined at the interface between electrode mount 110 and thermally conductive housing 310 by the stops 1000. The posts 900 and/or the stops 1000 may simply be protrusions from electrode mount 110 and/or thermally conductive housing 310, or they may be thermally conductive components (e.g., including, consisting essentially of, or consisting of one or more metals) affixed to or simply disposed between electrode mount 110 and/or thermally conductive housing 310. As shown in FIG. 11, particles 600 (e.g., in the form of shavings or small particulates) may be utilized with any of the embodiments depicted in FIGS. 8-10. Such particles 600 may provide an additional impediment to solder creep in embodiments of the present invention.

Figure 12A:
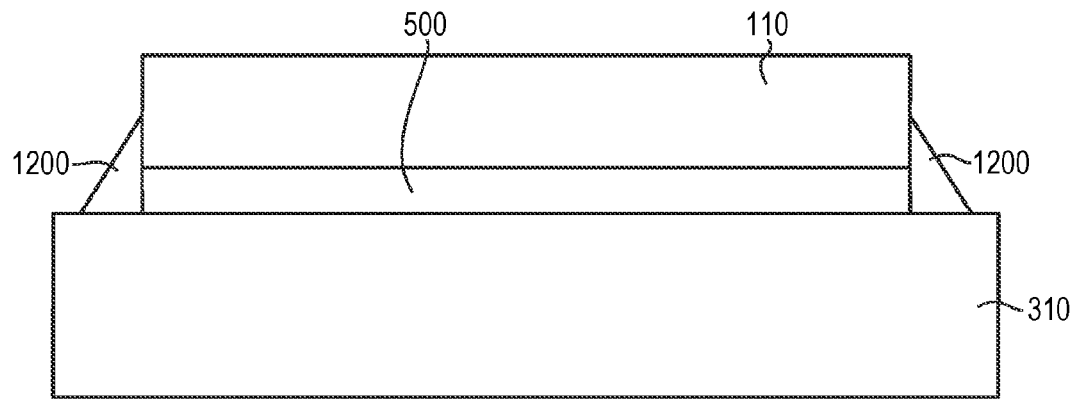
FIGS. 12A-12C are cross-sectional views of portions of laser devices incorporating adhesive layers for containing thermal bonding material in accordance with embodiments of the invention.
Figure 12B:
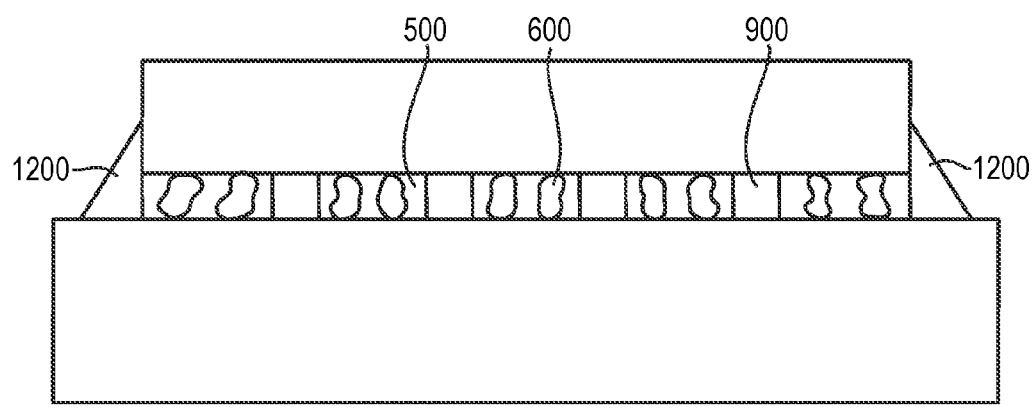
Figure 12C:
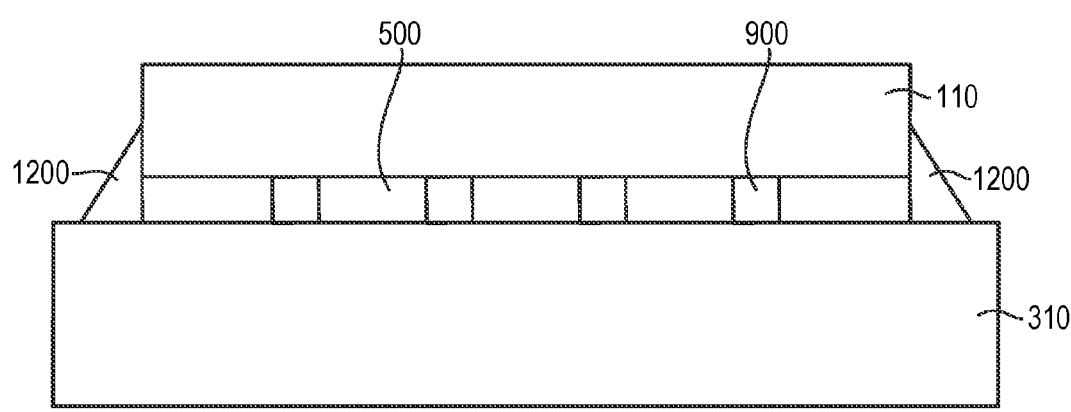

FIGS. 12A-12C depict exemplary embodiments of the present invention in which an adhesive 1200 is utilized to contain the thermal bonding material 500 between the electrode mount 110 and the thermally conductive housing 310 (or other components sharing an interface therebetween). As shown, an adhesive 1200 may be disposed along one or more edges of the electrode mount 110 and/or the thermally conductive housing 310 at the interface therebetween in order to form a barrier to egress of the thermal bonding material 500. The adhesive 1200 may include, consist essentially of, or consist of, for example, a thermally conductive epoxy and/or an epoxy containing metallic and/or thermally conductive fillers (e.g., particulates of metals such as nickel and/or silver). As shown in FIGS. 12B and 12C, the adhesive 1200 may be utilized in combination with posts 900. In such embodiments, the posts 900 may include, consist essentially of, or consist of the adhesive material of adhesive 1200 and may form a discontinuous collection of posts or a continuous mesh defining isolated pockets in which the thermal bonding material 500 is disposed. As shown in FIG. 12B, the adhesive 1200 and adhesive-based posts 900 may also be utilized in combination with particles 600.

Figure 13A:
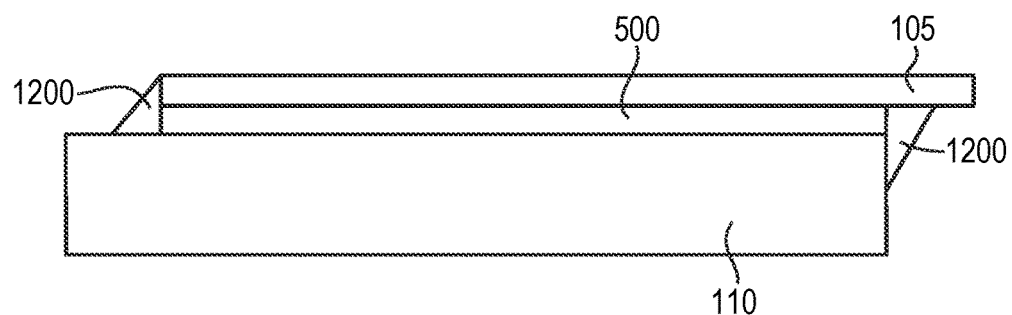
FIGS. 13A and 13B are cross-sectional views of portions of laser devices incorporating adhesive layers for containing thermal bonding material in accordance with embodiments of the invention.
Figure 13B:
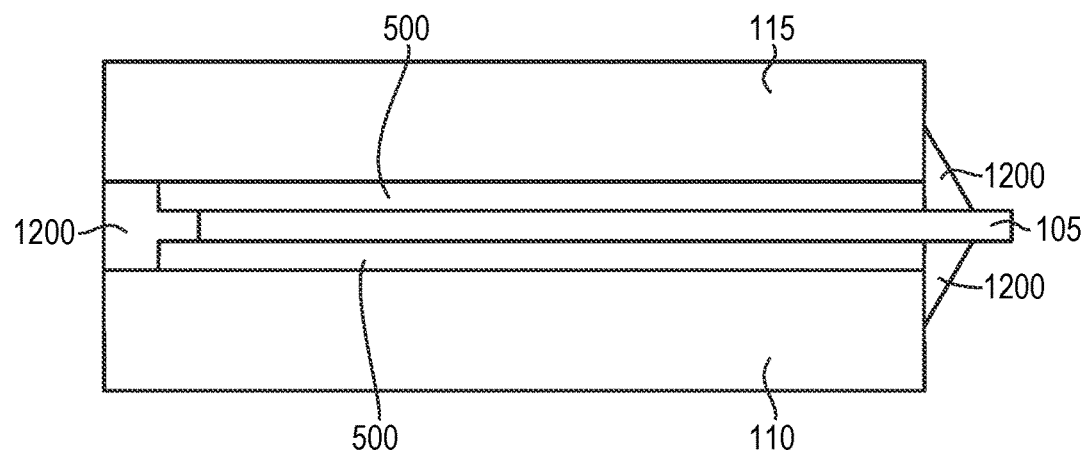
Figure 13C:
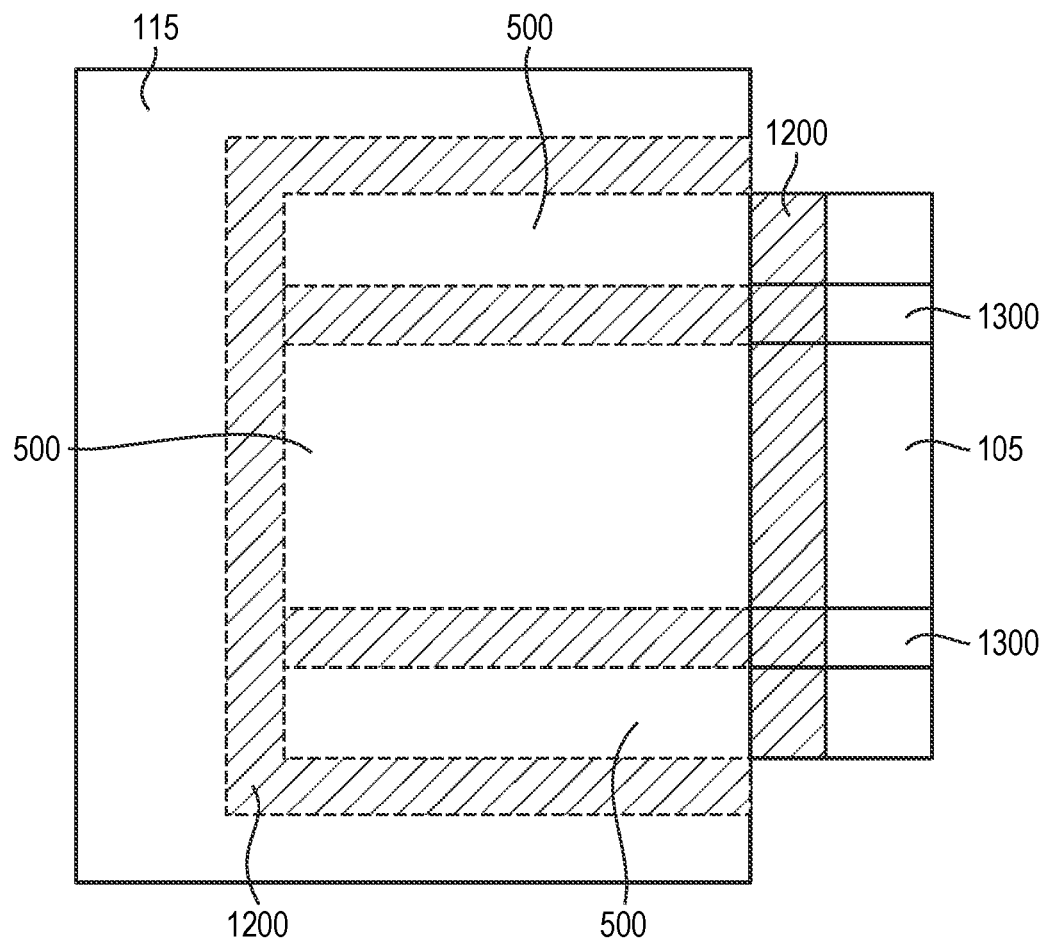
FIG. 13C is a plan view of portions of a laser device incorporating adhesive layers for containing thermal bonding material in accordance with embodiments of the invention.

FIGS. 13A-13C depict embodiments of the present invention in which the thermal bonding material 500 is disposed between the beam emitter 105 and the electrode mount 110 and/or the electrode mount 115. As shown, the adhesive 1200 may be disposed around and in contact with one or more sides of the beam emitter 105 and the electrode mount 110 and/or the electrode mount 115 at the interface therebetween in order to form a barrier to egress of the thermal bonding material 500. In such embodiments, the thermal bonding material 500 may be replaced by or supplemented with a thermal bonding layer 335 as detailed above; that is, the layer containing the thermal bonding material 500 may also incorporate one or more mesh support structures 510, particles 600, posts, and/or stops. As shown in FIG. 13C, the beam emitter 105 may define one or more channels 1300 therein for containing at least a portion of the adhesive 1200 therein. In various embodiments, the electrode mount 115 and/or the electrode mount 110 defines channels therewithin in addition to or instead of channels 1300 being defined by the beam emitter 105. As detailed herein, such channels of adhesive may advantageously contain various regions of the thermal bonding material 500 and thereby reduce or substantially eliminate solder creep between the beam emitter 105 and the electrode mount 115 and/or the electrode mount 110.

Figure 14:
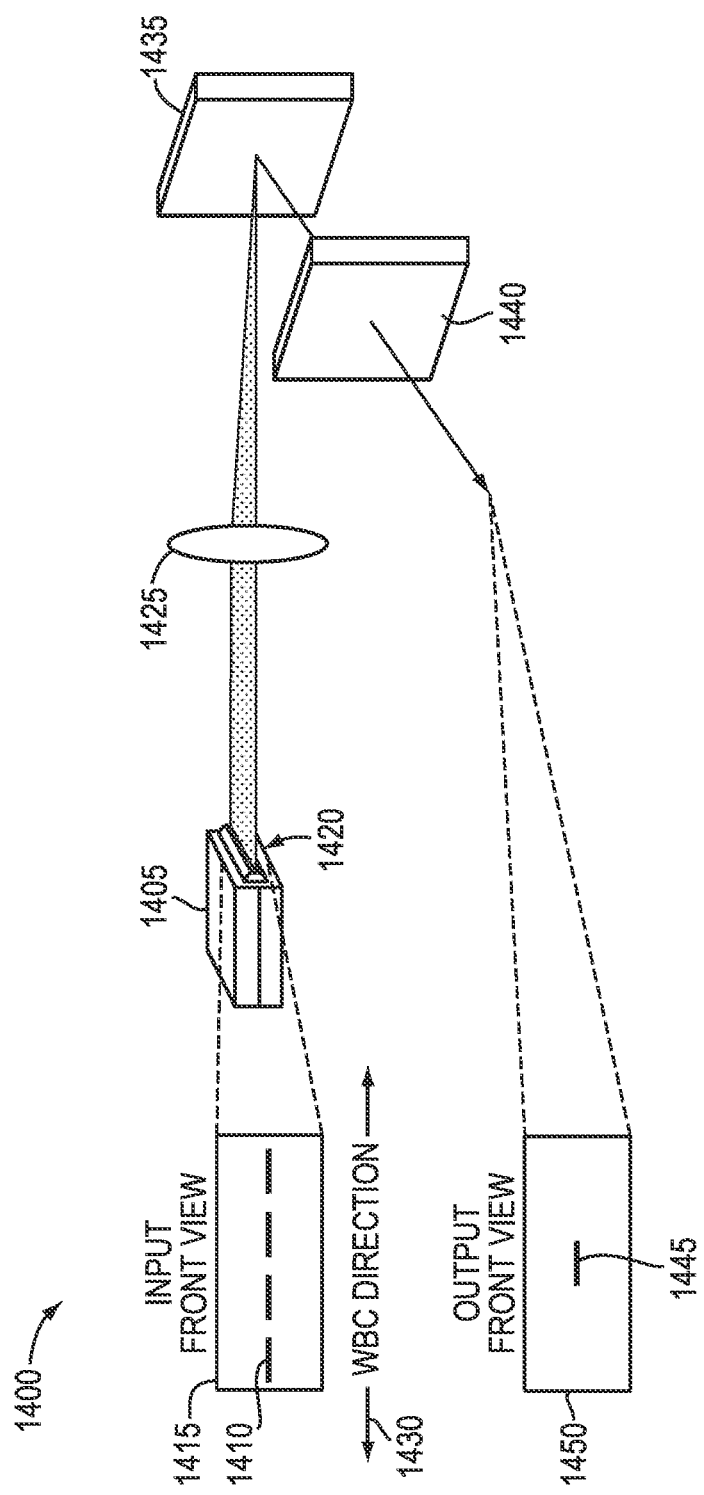
FIG. 14 is a schematic view of a wavelength beam combining laser system incorporating a packaged laser in accordance with embodiments of the invention.

Packaged lasers in accordance with embodiments of the present invention may be utilized in WBC laser systems. FIG. 14 depicts an exemplary WBC laser system 1400 that utilizes a packaged laser 1405. The packaged laser 1405 may correspond to, for example, lasers 100, 300, or 400 as detailed herein, and may incorporate, for example, a thermal bonding layer 335, thermal bonding material 500, mesh support structures 510, particles 600, posts 900, stops 1000, and/or adhesive 1200 as detailed herein. In the example of FIG. 14, laser 1405 features a diode bar having four beam emitters emitting beams 1410 (see magnified input view 1415), but embodiments of the invention may utilize diode bars emitting any number of individual beams or two-dimensional arrays or stacks of diodes or diode bars. In view 1415, each beam 1410 is indicated by a line, where the length or longer dimension of the line represents the slow diverging dimension of the beam, and the height or shorter dimension represents the fast diverging dimension. A collimation optic 1420 may be used to collimate each beam 1410 along the fast dimension. Transform optic(s) 1425, which may include or consist essentially of one or more cylindrical or spherical lenses and/or mirrors, are used to combine each beam 1410 along a WBC direction 1430. The transform optics 1425 then overlap the combined beam onto a dispersive element 1435 (which may include or consist essentially of, e.g., a diffraction grating such as a reflective or transmissive diffraction grating), and the combined beam is then transmitted as single output profile onto an output coupler 1440. The output coupler 1440 then transmits the combined beams 1445 as shown on the output front view 1450. The output coupler 1440 is typically partially reflective and acts as a common front facet for all the laser elements in this external cavity system 1400. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser apparatus comprising:
   a beam emitter having first and second opposed surfaces;
   a first electrode mount disposed beneath and in thermal contact with the first surface of the beam emitter, wherein the first electrode mount (i) is composed of a metallic material having an electrical conductivity at 20° C. of at least $1 \times 10^6$ S/m and (ii) is electrically connected to an electrode of the beam emitter;
   a thermally conductive housing body disposed beneath the first electrode mount, wherein the housing body comprises an insulating layer to prevent electrical conduction between the housing body and the first electrode mount;
   a thermal bonding layer disposed between the first electrode mount and the insulating layer of the housing body, the thermal bonding layer (i) improving thermal conduction between the first electrode mount and the housing body, and (ii) comprising a thermal bonding material, wherein the thermal bonding material comprises a metallic solder, paste, or gel; and
   a creep-mitigation system for preventing or retarding movement of the thermal bonding material out of the thermal bonding layer, the creep-mitigation system comprising a plurality of thermally conductive particles interspersed within the thermal bonding layer.

2. The laser apparatus of claim 1, wherein the thermal bonding material comprises indium.

3. The laser apparatus of claim 1, wherein the creep-mitigation system comprises a mesh support structure defining a plurality of openings therein, at least a portion of the thermal bonding material being disposed in the openings.

4. The laser apparatus of claim 1, wherein the plurality of thermally conductive particles interspersed within the thermal bonding layer are electrically insulating.

5. The laser apparatus of claim 1, wherein the creep-mitigation system comprises a plurality of recessed channels defined by at least one of the first electrode mount or the housing body, at least some of the thermal bonding material being disposed within the channels.

6. The laser apparatus of claim 5, wherein each of the channels is filled with the thermal bonding material.

7. The laser apparatus of claim 1, wherein the creep-mitigation system comprises a plurality of posts defined by at least one of the first electrode mount or the housing body and protruding therefrom, each of the posts spanning at least a portion of a distance between the first electrode mount and the housing body.

8. The laser apparatus of claim 1, wherein the creep-mitigation system comprises one or more stops disposed around at least a portion of a perimeter of the thermal bonding layer.

9. The laser apparatus of claim 1, wherein the creep-mitigation system comprises an adhesive layer disposed around at least a portion of a perimeter of the thermal bonding layer, wherein (a) the adhesive layer is disposed in contact with the first electrode mount, housing body, and thermal bonding material, and (b) the adhesive layer is not disposed between the first electrode mount and the housing body.

10. The laser apparatus of claim 9, wherein (i) the adhesive layer comprises a thermally conductive adhesive, and (ii) the creep-mitigation system further comprises a plurality of posts spanning at least a portion of a distance between the first electrode mount and the housing body, each of the posts being composed of the thermally conductive adhesive.

11. The laser apparatus of claim 1, further comprising a second electrode mount (i) disposed over and in thermal contact with the second surface of the beam emitter and (ii) electrically insulated from the first electrode mount except for any electrical connection through the beam emitter.

12. The laser apparatus of claim 1, wherein the beam emitter comprises a diode bar emitting a plurality of discrete beams.

13. A laser apparatus comprising:
    a beam emitter having first and second opposed surfaces;
    a first electrode mount disposed beneath the first surface of the beam emitter;
    a thermal bonding layer disposed between the first electrode mount and the first surface of the beam emitter, the thermal bonding layer (i) improving thermal conduction between the first electrode mount and the beam emitter, and (ii) comprising a thermal bonding material; and
    a creep-mitigation system for preventing or retarding movement of the thermal bonding material out of the thermal bonding layer,
    wherein the creep-mitigation system comprises (A) a plurality of posts spanning an entire distance between the beam emitter and the first electrode mount to thereby take up clamping force therebetween, and (B) an adhesive layer (i) disposed around at least a portion of a perimeter of the thermal bonding layer, and (ii) comprising an adhesive material, wherein (a) the adhesive layer is disposed in contact with the first electrode mount, beam emitter, and thermal bonding material, and (b) the adhesive layer is not disposed between the first electrode mount and the beam emitter.

14. The laser apparatus of claim 13, wherein the adhesive layer comprises a thermally conductive adhesive material.

15. The laser apparatus of claim 13, further comprising:
a second electrode mount (i) disposed over and in thermal contact with the second surface of the beam emitter and (ii) electrically insulated from the first electrode mount except for any electrical connection through the beam emitter;
a second thermal bonding layer disposed between the second electrode mount and the second surface of the beam emitter, the second thermal bonding layer (i) improving thermal conduction between the second electrode mount and the beam emitter, and (ii) comprising a second thermal bonding material; and
an adhesive layer disposed around at least a portion of a perimeter of the second thermal bonding layer.

16. The laser apparatus of claim 13, wherein the beam emitter comprises a diode bar emitting a plurality of discrete beams.

17. A laser apparatus comprising:
a beam emitter having first and second opposed surfaces;
a first electrode mount disposed beneath the first surface of the beam emitter, wherein (i) the beam emitter only partially overlaps the first electrode mount to thereby define a region of overlap between the beam emitter and the first electrode mount, and (ii) at least one of the beam emitter or the first electrode mount defines a plurality of recessed channels therein;
a thermal bonding layer disposed between the first electrode mount and the first surface of the beam emitter in the region of overlap, the thermal bonding layer (i) improving thermal conduction between the first electrode mount and the beam emitter, and (ii) comprising a thermal bonding material; and
an adhesive layer surrounding the entire region of overlap and being disposed within the plurality of channels to thereby define (i) a plurality of isolated pockets of the thermal bonding material each surrounded on all sides by adhesive material, and (ii) a portion of the adhesive layer disposed in contact with the first electrode mount, the beam emitter, and the thermal bonding material but not disposed between the first electrode mount and the beam emitter.

18. A wavelength beam combining laser system comprising:
a beam emitter emitting a plurality of discrete beams and having first and second opposed surfaces;
focusing optics for focusing the plurality of beams onto a dispersive element;
a dispersive element for receiving and dispersing the received focused beams;
a partially reflective output coupler positioned to receive the dispersed beams, transmit a portion of the dispersed beams therethrough as a multi-wavelength output beam, and reflect a second portion of the dispersed beams back toward the dispersive element;
a first electrode mount disposed beneath and in thermal contact with the first surface of the beam emitter, wherein the first electrode mount (i) is composed of a metallic material having an electrical conductivity at 20° C. of at least $1\times10^6$ S/m and (ii) is electrically connected to an electrode of the beam emitter;
a thermally conductive housing body disposed beneath the first electrode mount, wherein the housing body comprises an insulating layer to prevent electrical conduction between the housing body and the first electrode mount;
a thermal bonding layer disposed between the first electrode mount and the insulating layer of the housing body, the thermal bonding layer (i) improving thermal conduction between the first electrode mount and the housing body, and (ii) comprising a thermal bonding material, wherein the thermal bonding material comprises a metallic solder, paste, or gel; and
a creep-mitigation system for preventing or retarding movement of the thermal bonding material out of the thermal bonding layer, the creep-mitigation system comprising a plurality of thermally conductive particles interspersed within the thermal bonding layer.

19. The laser system of claim 18, wherein the dispersive element comprises a diffraction grating.

20. The laser system of claim 18, wherein the creep-mitigation system comprises a mesh support structure defining a plurality of openings therein, at least a portion of the thermal bonding material being disposed in the openings.

21. The laser system of claim 18, wherein the plurality of thermally conductive particles interspersed within the thermal bonding layer are electrically insulating.

22. The laser system of claim 18, wherein the creep-mitigation system comprises a plurality of recessed channels defined by at least one of the first electrode mount or the housing body, at least some of the thermal bonding material being disposed within the channels.

23. The laser system of claim 18, wherein the creep-mitigation system comprises a plurality of posts defined by at least one of the first electrode mount or the housing body and protruding therefrom, each of the posts spanning at least a portion of a distance between the first electrode mount and the housing body.

24. The laser apparatus of claim 18, wherein the creep-mitigation system comprises one or more stops disposed around at least a portion of a perimeter of the thermal bonding layer.

25. The laser apparatus of claim 18, wherein the creep-mitigation system comprises an adhesive layer disposed around at least a portion of a perimeter of the thermal bonding layer, wherein (a) the adhesive layer is disposed in contact with the first electrode mount, housing body, and thermal bonding material, and (b) the adhesive layer is not disposed between the first electrode mount and the housing body.

26. The laser system of claim 22, wherein each of the channels is filled with the thermal bonding material.

* * * * *